US009547745B1

(12) United States Patent
Juang et al.

(10) Patent No.: US 9,547,745 B1
(45) Date of Patent: Jan. 17, 2017

(54) SYSTEM AND METHOD FOR DISCOVERING UNKNOWN PROBLEMATIC PATTERNS IN CHIP DESIGN LAYOUT FOR SEMICONDUCTOR MANUFACTURING

(71) Applicant: DMO Systems Limited, Hsinchu County (TW)

(72) Inventors: Shauh-Teh Juang, Saratoga, CA (US); Jason Zse-Cherng Lin, Saratoga, CA (US)

(73) Assignee: DMO Systems Limited, ZhuBei (TW)

( * ) Notice: Subject to any disclaimer, the term of this patent is extended or adjusted under 35 U.S.C. 154(b) by 55 days.

(21) Appl. No.: 14/810,428

(22) Filed: Jul. 27, 2015

(51) Int. Cl.
*G06F 17/50* (2006.01)
(52) U.S. Cl.
CPC ....... *G06F 17/5081* (2013.01); *G06F 17/5009* (2013.01)
(58) Field of Classification Search
CPC .. G03F 7/705; G06F 17/5081; G06F 2217/12; G01R 31/318335; G01R 31/318342; G01R 31/318357
USPC ...................... 716/51–56, 106, 112
See application file for complete search history.

(56) References Cited

U.S. PATENT DOCUMENTS

| | | | | |
|---|---|---|---|---|
| 2005/0044514 A1* | 2/2005 | Wu | ...................... | G06F 17/5081 716/52 |
| 2006/0123380 A1* | 6/2006 | Ikeuchi | ............... | G06F 17/5081 716/52 |
| 2007/0250805 A1* | 10/2007 | Wang | ........................ | G03F 1/84 716/52 |

* cited by examiner

*Primary Examiner* — Paul Dinh
(74) *Attorney, Agent, or Firm* — Lin & Associates Intellectual Property, Inc.

(57) ABSTRACT

A system includes a critical signature library for storing critical signature databases of chip design layouts in semiconductor manufacturing and a statistical model creator for creating statistical models based on the known problematic circuit patterns stored in the critical signature databases and a target specification based on deviation between physical measurement and simulation data or design data associated with the known problematic circuit patterns. The system further has a statistical model based predictor for predicting and discovering unknown problematic circuit patterns by applying the statistical models to a large number of candidate circuit patterns generated from a random layout generator, or extracted from the chip design layout based on hot spot sites determined by extended lithographic process check on the chip design layout or inspecting wafers manufactured with the chip design layout with an aggressive sensitivity setting.

28 Claims, 4 Drawing Sheets

SYSTEM AND METHOD FOR DISCOVERING UNKNOWN PROBLEMATIC PATTERNS IN CHIP DESIGN LAYOUT FOR SEMICONDUCTOR MANUFACTURING

BACKGROUND OF THE INVENTION

1. Field of the Invention

The present invention relates generally to semiconductor device fabrication, and more specifically to a system and method for discovering unknown problematic circuit patterns in chip design layout for semiconductor device manufacturing.

2. Description of Related Art

The following description and examples are not admitted to be prior art by virtue of their inclusion in this section.

Semiconductor devices are manufactured by fabricating many layers of circuit patterns on wafers to form a massive number of transistors for integration as complicated circuits. In the manufacturing flow of semiconductor devices, lithographic process (LP) is responsible for transferring circuit patterns created by circuit designers onto wafers.

Photomasks/reticles with opaque and clear patterns according to the circuit patterns are used for patterning device layers on wafers. Distortion of the patterns can result from the effect of the neighboring patterns on the photomask and optical diffraction, photoresist development and etching, chemical-mechanical polishing (CMP) on adjacent layers of the wafer, and geometric and overlaying relationships between patterns of adjacent layers fabricated on the wafer. As the component density of the integrated circuits (ICs) has increased the complexity of the IC patterns and layouts, distortion of the patterns often results in systematic defects that fail the device fabricated on the wafer or critical dimension (CD) errors that degrade the device performance.

FIG. 1 shows a typical flow in initial setup and on-going tune-up for optimizing the lithography process of manufacturing semiconductor devices. Circuit patterns for manufacturing the photomask of a device layer is described in a design data file generated by the circuit designer shown in block 101 that contains design data in GDS or OASIS format. The design data may be random layout circuit patterns generated from a random layout generator (RLG) or product qualification vehicle (PQV) from vendors or pilot customers. Block 102 shows optical proximity correction (OPC) creation that generates the required OPC by using the OPC model and recipe from block 103. After OPC creation, block 102 also performs OPC verification and lithographic process check (LPC) verification based on models of OPC and design for manufacturing (DFM).

OPC and LPC verification also predicts potential yield limiting hot spots caused by specific layout and patterns. As shown in block 104, wafers manufactured by the lithography process using the OPC photomask are examined by either optical or e-beam inspection and metrology tool to detect defects and measure critical dimensions in the hot spots. Inspection and metrology data of the predicted hot spots are fed back to block 103 to tune the models and recipes of OPC and DFM. In general, it is not easy to achieve perfect OPC/DFM models/recipes because the patterning errors come from various proximity and underneath effects including optical, chemical, etching, CMP and other processes as well as photomask/reticle errors. Even worse, some effects are short range and some are long range.

OPC is effective in achieving linewidth control if optical conditions during lithography match the simulated optical conditions used to arrive at the OPC solution. Defocus and exposure dose variations result in linewidth variation even after OPC. Focus variation during lithography is caused by changes in resist thickness, wafer topography and relative distance between wafer plane and the lens system. The dose variation typically comes from the scanner or from the illumination in the optical lithography system. Depth of focus and exposure latitude define the process window of a lithography system. Latest advances in process window aware OPC guarantee acceptable lithography quality but linewidth still varies within the process window. Linewidth variation has a direct impact on timing and leakage of designs.

Lithographic process simulation is typically used to simulate the circuit patterns and predict hot spots that are likely to cause pattern distortion. OPC and LPC are important techniques commonly used for correcting the pattern distortion. CMP simulation may also be performed on the circuit layout to determine hot spots. Alternatively, physical failure analysis (PFA) may be performed on the devices to identify hot spots. Process monitoring by sampling and inspecting wafers using the predicted or identified hot spots is necessary to ensure that systematic defects are identified and eliminated for manufacturing the semiconductor devices with high yield.

One approach commonly used in process monitoring is to collect scanning electron microscopic (SEM) images from a significant number of hot spots by sampling dies and wafers in the manufacturing flow. The hot spots may be predicted by LPC, CMP and other experience and a priori knowledge, or identified by PFA. Ideally, the more predicted hot spots, the less chance of missing critical defects. In practice, however, the number of hot spots used in process monitoring cannot overload the wafer inspectors and many of the predicted hot spots may also turn out to be non-systematic or non-critical because of modelling errors. How to predict the hot spots with most accuracy and good thoroughness has been a big challenge to the semiconductor manufacturers.

There is another drawback in the existing approaches to predicting the hot spots based on LP or CMP simulation of the chip design layout. Because the hot spots are predicted by applying LP or CMP model on the known chip design layout, the circuit patterns predicted as hot spots are limited within the available circuit patterns in the known chip design layout. A catastrophic systematic defect may occur in a revision of the chip design that includes new circuit patterns not covered by the hot spots. In addition, a well-qualified process line in the semiconductor fab may still run the risk of missing yield limiting defects when the semiconductor device of a new chip design is fabricated.

SUMMARY OF THE INVENTION

The present invention has been made to overcome the above mentioned challenges and drawbacks in predicting and discovering problematic circuit patterns of a chip design layout for manufacturing semiconductor devices. Accordingly, a primary object of the present invention is to provide a system including a critical signature library, a statistical model creator and a statistical model based predictor for discovering unknown problematic circuit patterns.

The critical signature library of the present invention is a storage device configured to store a library of critical signature databases. Each critical signature database includes a plurality of known problematic circuit patterns of a chip design layout with their corresponding physical measurement data obtained from manufacturing process and simulation data associated with the physical measurement.

Each critical database also stores statistical models created by the statistical model creator for the corresponding chip design layout.

The statistical model creator divides the known problematic circuit patterns stored in a critical signature database into a model training data set and a model validation data set. Each data set includes a certain amount of known problematic circuit patterns from the critical signature database. The statistical model creator extracts features from the known circuit patterns, creates statistical models using the model training data set and validates the statistical models with the model validation data set according to desired target specifications based on deviation between physical measurement data and simulation data or design data.

The statistical model based predictor receives a large number of candidate circuit patterns, extracts features from them, predicts and discovers unknown problematic circuit patterns according to one or more statistical models stored in the corresponding critical signature database. The candidate circuit patterns may be generated by extracting design clips from the chip design layout by dividing the design layout into smaller tiles, by applying lithographic process simulation on the chip design layout to identify hot spot locations with an aggressive setting, or by finding defective locations from inspecting wafers manufactured with the chip design layout using an aggressive sensitivity setting.

It is also an object of the present invention to provide a method of discovering unknown problematic circuit patterns of the chip design layout for semiconductor manufacturing. The method first preparing a critical signature library including at least one critical signature database having a plurality of known problematic circuit patterns extracted from the chip design layout. Each problematic circuit pattern may also have associated physical data measured from manufactured semiconductor devices and simulation data generated based on the chip design layout stored in the corresponding critical signature database.

The method then creates one or more statistical models based on the plurality of known problematic circuit patterns according to a target specification based on deviation between the associated physical data and simulation data or design data. The created statistical models are saved in the corresponding critical signature database.

A large number of candidate circuit patterns are generated from the chip design layout or inspecting wafers manufactured with the chip design layout. Each of the candidate circuit patterns is then predicted and labeled as being problematic or not according to one or more statistical models. If a candidate circuit pattern is labelled as being problematic, it is compared with the known problematic circuit patterns already stored in the corresponding critical signature database. If the candidate circuit pattern labelled as being problematic does not match any of the known problematic circuit patterns, the candidate circuit pattern is saved in the corresponding critical signature database and removed from further prediction.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Figure 1:
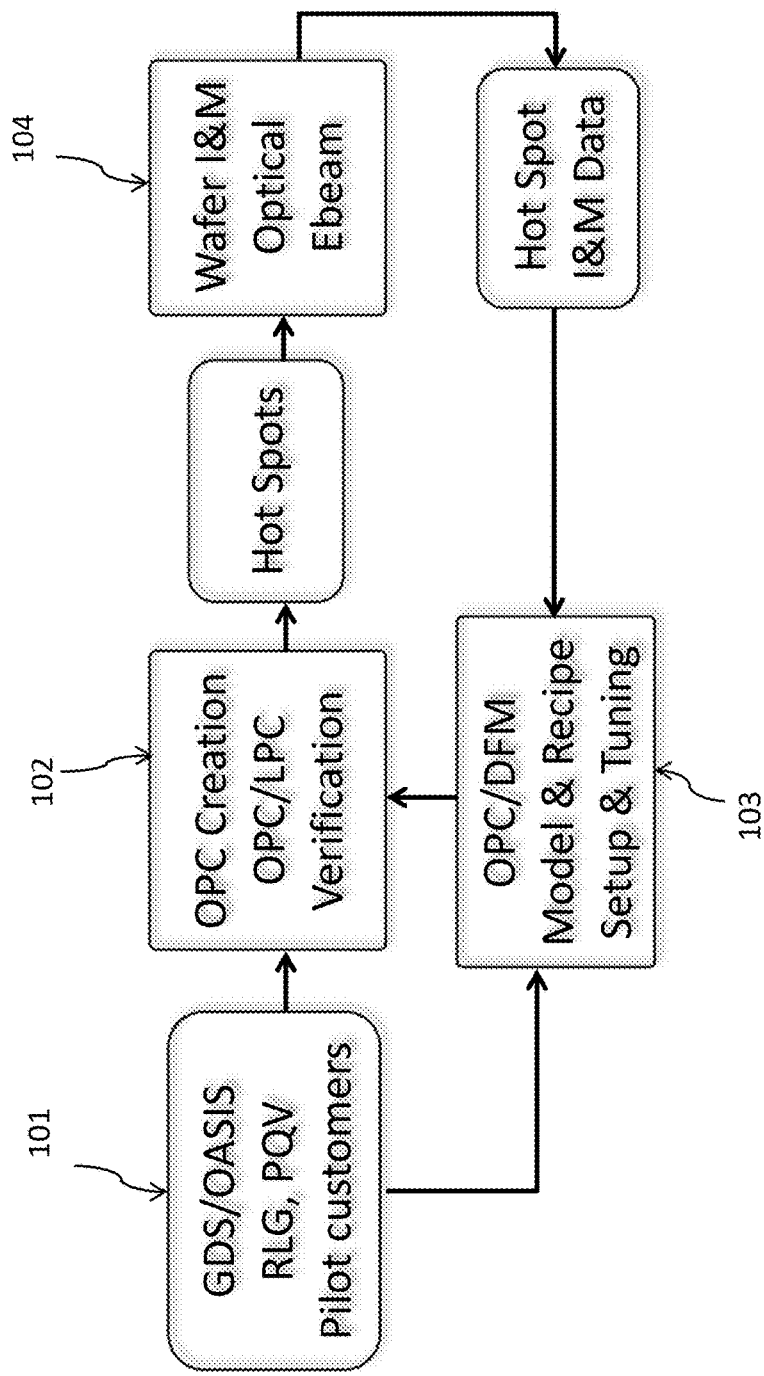
FIG. 1 shows a typical flow in initial setup and tuning for optimizing the lithography process of manufacturing semiconductor devices.
Figure 2:
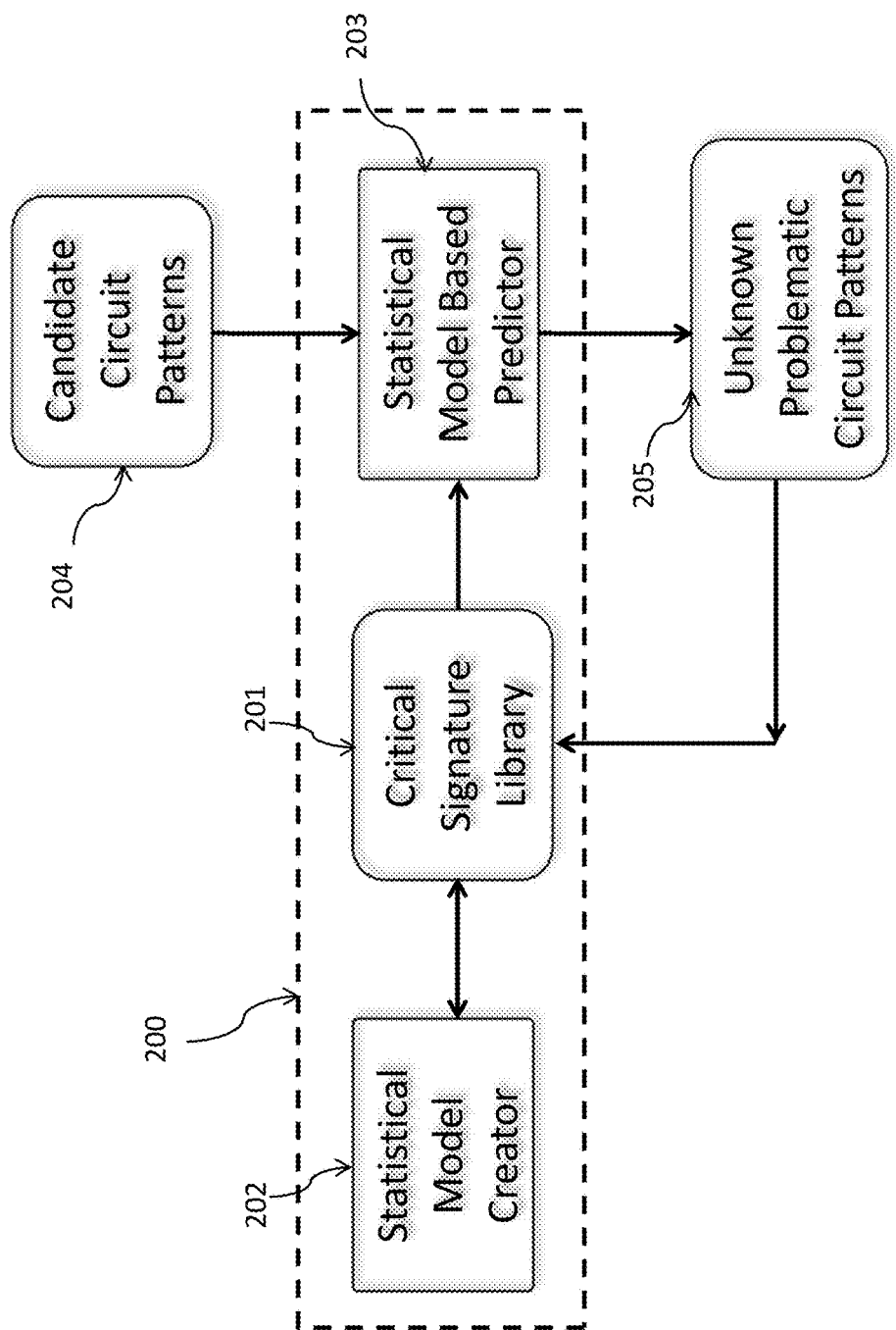
FIG. 2 shows the block diagram of a system for discovering unknown problematic circuit patterns of a chip design layout for semiconductor manufacturing according to the present invention.

FIG. 2 shows a block diagram of the system 200 for discovering problematic circuit patterns in chip design layout according to the present invention. With reference to FIG. 2, the system 200 comprises a critical signature library 201, a statistical model creator 202, and a statistical model based predictor 203.

Figure 3:
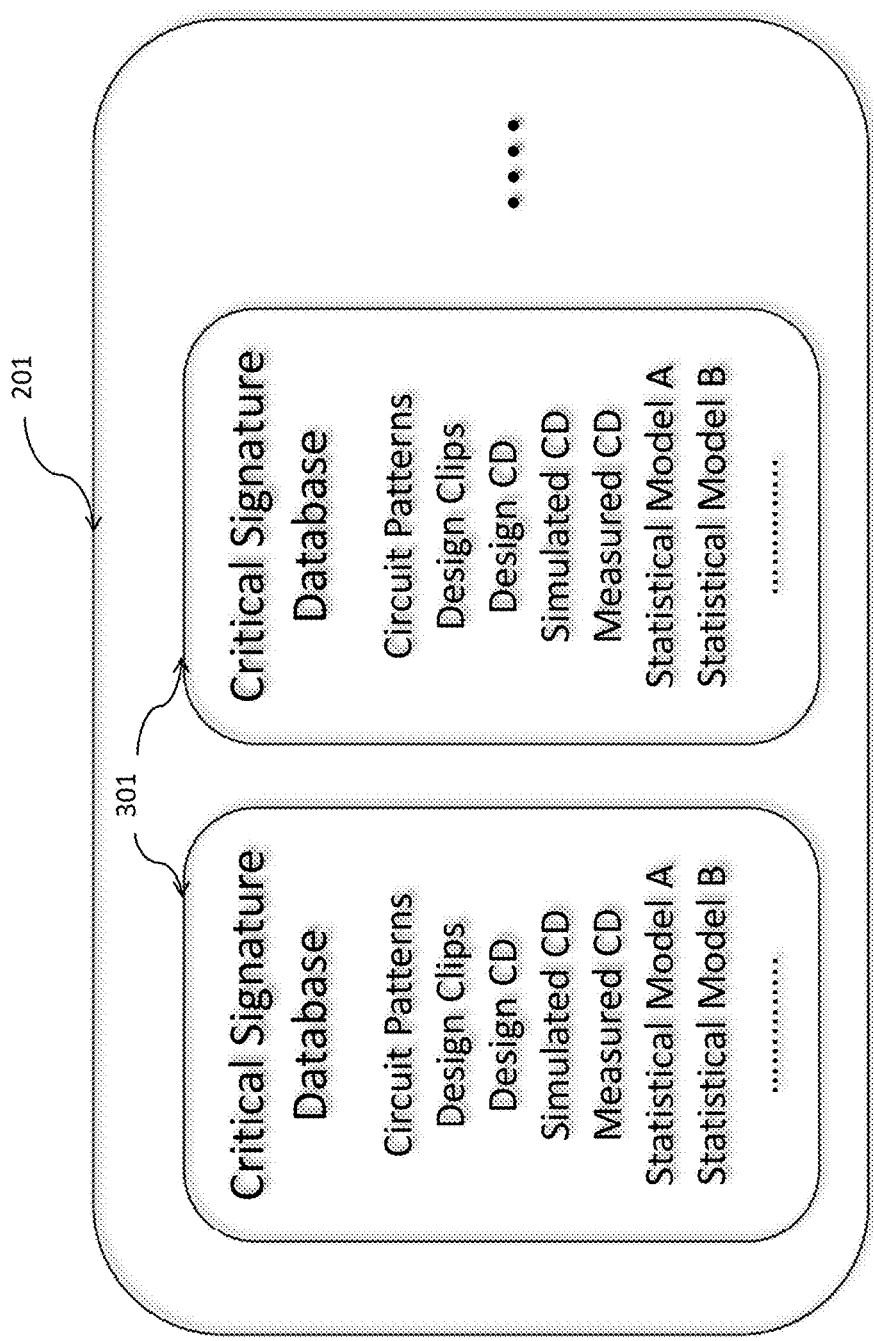
FIG. 3 shows the critical signature library that stores a number of critical signature databases according to the present invention.

The critical signature library 201 is a storage device configured to store a library of critical signature databases 301 as shown in FIG. 3. In the critical signature library 201, various indexes may be used to index each critical signature database 301. For example, the database may be indexed by technology nodes such as 14 nm, 10 nm or 7 nm technology node, or indexed by manufacturing lines, etc. Each critical signature database 301 includes a plurality of known problematic circuit patterns along with their corresponding physical measurement data such as defect image patches or critical dimension (CD) measurements acquired from manufacturing process, and the simulation data associated with the physical measurement.

In the present invention, each critical signature database 301 also includes at least one statistical model created by the statistical model creator 202 based on the plurality of known problematic circuit patterns. In order to validate the accuracy of the statistical model, the known problematic circuit patterns are divided into a model training data set and a model validation data set. Each data set includes a certain amount of known problematic circuit patterns from the critical signature database 301.

In the creation of the statistical model, a model target specification is set for the creation of the statistical mode. In a preferred embodiment of the present invention, the model target specification is set based on the deviation between the physical measurement data and the simulation data or design data. For example, for a known problematic circuit pattern, the simulated CD data can be computed from the LP simulation using the design clip of the known problematic circuit pattern. A model target specification may be set as being greater than 10% in the CD deviation between the physical CD measurement and the simulated CD data or design CD data. In other words, an ideal statistical model created from the model training data set is that all the problematic circuit patterns in the model training data set that have more than 10% CD deviation satisfy the statistical model, and all the problematic circuit patterns in the model training data set that have less than 10% CD deviation does not satisfy the statistical model.

According to the present invention, a set of features are extracted from the design clip corresponding to the problematic circuit pattern. Examples of the features extracted from each problematic circuit pattern are pattern density, pattern perimeter, minimum or maximum linewidth, minimum or maximum spacing, pattern orientation, number of edges, inside or outside corners, spatial frequency distribution, . . . , etc. These features are only examples and many others can be apparent to those skilled in the art.

With a target specification of deviation between the associated physical measurement and simulation data or design data, a statistical model can be trained using the features extracted from each problematic circuit pattern in the model training data set. Many model training algorithms have been widely used in statistical data analysis and data mining. For example, modeling algorithms based on decision tree, linear regression, nonlinear regression, support vector machine (SVM), k-Means clustering, hierarchical clustering, . . . , etc. All those modeling algorithms can be applied to the model training data set to establish a statistical model for the problematic circuit pattern in the model training data set.

After a statistical model for the model training data set has been established, the statistical model is applied to the model validation data set. The same set of features is extracted from the design clip corresponding to each problematic circuit pattern in the model validation data set. The statistical model is used to predict the behavior of each problematic circuit pattern in the model validation data set.

As an example, a statistical model can be established based on a model target specification of being greater than 10% in the CD deviation between the physical CD measurement and the simulated CD data or design CD data using the model training data set. By applying the established statistical model to the set of features of a problematic circuit pattern in the model validation set, whether the CD deviation corresponding to each problematic circuit pattern should meet the target specification can be predicted.

In the process of model validation, the predicted result of each problematic circuit pattern in the model validation data set is checked against its CD deviation of the physical CD measurement from the simulated CD data or design CD data to determine if the prediction matches the truth. The model accuracy can be determined based on how many problematic circuit patterns in the model validation data set have been predicted correctly. The robustness of a statistical model can be judged based on the model accuracy of the statistical model.

In accordance with the present invention, the statistical model created for each critical signature database 301 by the statistical model creator 202 is stored in the corresponding critical signature database 301 as shown in FIG. 3. Multiple statistical models may be established and saved for a corresponding critical signature database 301 by using different modeling algorithms or different sets of features extracted from the problematic circuit patterns in the critical signature database 301.

The statistical models for the critical signature database 301 are used by the statistical model based predictor 203 of the present invention to predict and discover unknown problematic circuit patterns 205. As shown in FIG. 2, the statistical model based predictor 203 predicts the unknown problematic circuit patterns 205 from candidate circuit patterns 204 based on the statistical models saved in the critical signature database 301 of the critical signature library 201.

In order to discover unknown problematic circuit patterns, a sufficient number of the candidate circuit patterns 204 should be provided. According to the present invention, the candidate circuit patterns 204 may be generated by a random layout generator (RLG) during the initial qualification of a technology node or manufacture line based on the specification of the targeted semiconductor technology such as design rules, DFM rules, process models, standard cells, . . . , etc.

For the production of a given chip design layout, a large set of all possible circuit patterns can be generated from the chip design layout as the candidate circuit patterns 204 by dividing the chip design layout into many small tiles, and performing some coarse filtering to eliminate blank or non-critical areas. The disadvantage of this approach is that the computation required to generate all possible circuit patterns can be very expensive and the number of candidate circuit patterns may be too many to manage. In addition, many of the possible circuit patterns may only include trivial patterns that are unlikely to be problematic.

The present invention provides another approach for generating the candidate circuit patterns by using LPC tools. The hot spot detection available in LPC tools can be used to simulate and analyze the lithographic process with the chip design layout to generate the candidate circuit patterns 204. By using an aggressive threshold with an extended process window setting to amplify the potential systematic problems, many hot spots can be identified and their corresponding circuit patterns can be extracted from the chip design layout as the candidate circuit patterns 204.

During the initial ramp-up of manufacturing a semiconductor device, the candidate circuit patterns 204 can also be generated by using wafer inspectors with an aggressive sensitivity setting to inspect wafers and detect potential systematic defect sites. Wafers with focus exposure matrix (FEM) can be particularly useful in identifying potential defect sites at various process windows. The corresponding circuit patterns of the identified potential defect sites can be extracted from the chip design layout of the semiconductor device and serve as the candidate circuit patterns 204.

According to the present invention, the statistical model based predictor 203 extracts the corresponding sets of features that have been used in creating the statistical models from all the candidate circuit patterns 204. Each statistical model is applied to the corresponding set of features to predict and label each candidate circuit pattern as being problematic or not. The candidate circuit pattern that has been predicted as problematic is identified as a problematic circuit pattern 205 and removed from further prediction to be done by other statistical models.

The predicted problematic circuit pattern 205 is saved in the critical signature database 301 if the same circuit pattern does not exist in the critical signature database 301. If the predicted problematic circuit pattern is a newly discovered problematic circuit pattern, the problematic circuit pattern can be included and verified in a future test vehicle. The newly discovered problematic circuit pattern should also be fixed in the chip design layout immediately.

In the present invention, statistical model based predictor 203 uses the full ensemble of the established statistical models to check the candidate circuit patterns 204 by applying each statistical model established for a given critical signature database 301 to the candidate circuit patterns 204. It can be understood that the success of discovering unknown problematic circuit patterns relies on the accuracy and thoroughness of the established statistical models.

It should also be noted that the gist of the present invention resides on modeling the effect of the semiconductor manufacturing process on the circuit patterns of a chip design layout with statistical models based on features extracted from the circuit patterns. A good statistical model can be established only if the features used in the modeling can capture the effect of the semiconductor manufacturing process on the circuit patterns.

It has been well known and observed that optical proximity effect plays an important role in patterning the chip design layout. In order to improve the accuracy and thoroughness of the established statistical models, the features used in the statistical model creator 202 of the present invention for establishing statistical models include features extracted from design clips of different sizes for the circuit patterns in the critical signature database 302. By having different sizes of circuit patterns, the optical proximity effect can better be captured in the statistical models.

Because the circuit patterns are stacked layer by layer in manufacturing the semiconductor device, in addition to using circuit patterns of different sizes for feature extraction, the present invention also uses design clips of the layers underneath the current design layer for extracting features to capture the effects of multiple circuit layers. Boolean operators such as OR, Exclusive OR, AND, NOT, etc., can be applied to the design clips including the current layer and underneath layers to form a composite circuit pattern for feature extraction.

Figure 4:
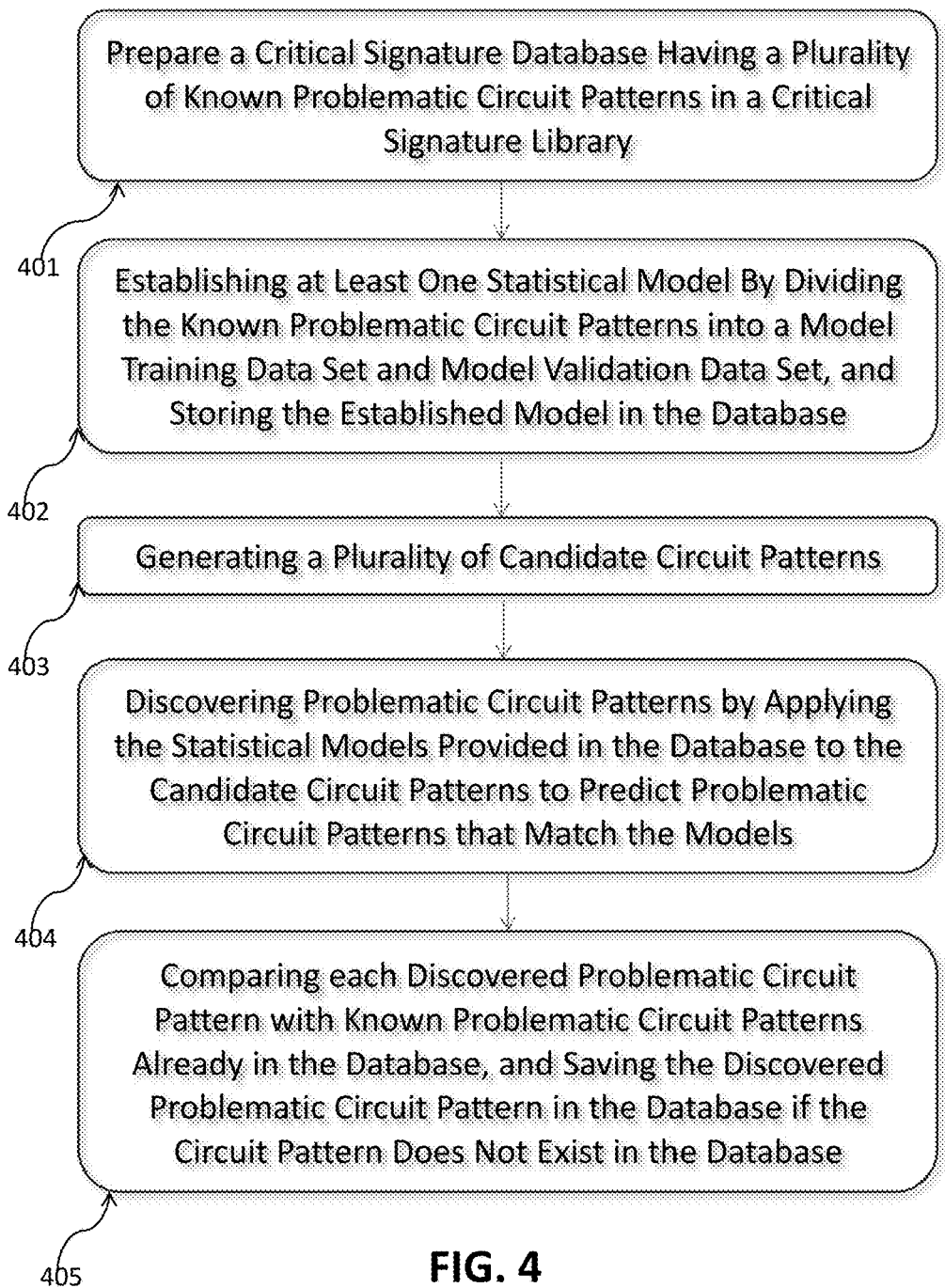
FIG. 4 shows a flow chart of the method for discovering unknown problematic circuit patterns of a chip design layout for semiconductor manufacturing according to the present invention.

FIG. 4 shows a flow chart summarizing the method for discovering unknown problematic circuit patterns according to the present invention. A critical signature database is prepared and stored in a critical signature library in step 401 of the method. The critical signature database includes a plurality of known problematic circuit patterns. At least a statistical model is established by dividing the known problematic circuit patterns into a model training data set and a model validation data set in step 402. The established statistical model is stored in the corresponding critical signature database.

In step 403, a plurality of candidate circuit patterns are generated. The candidate circuit patterns may be generated from RLG, chip design layout or inspecting FEM wafers. The statistical models provided by the critical signature database are applied to each candidate pattern to predict if the candidate pattern is a problematic circuit pattern or not in step 404. If a candidate pattern is predicted as being problematic, it is removed from the plurality of candidate circuit patterns and no longer applied with other statistical models for further prediction.

In step 405, a problematic circuit pattern discovered in step 404 is compared with the known problematic circuit patterns already in the corresponding critical signature database. If the discovered problematic circuit pattern does not exist in the database, the discovered problematic circuit pattern is saved in the database.

As described before, the method of discovering unknown problematic circuit patterns can be used in the initial qualification of a new technology node or manufacturing line. It can also be used in the ramp-up stage of manufacturing a semiconductor device to uncover and fix the problematic circuit patterns in the chip design layout before starting the expensive and time-consuming manufacturing cycle. The method can also be used to discover unknown problematic circuit patterns if the chip design layout has a revision. The candidate circuit patterns can be extracted from the portion of the chip design layout that has been changed in the revision. When a manufacturing line is prepared to manufacture a new semiconductor device, the method can also help discover the unknown problematic circuit patterns that may exist in the chip design layout of the new semiconductor device.

It may be worth mentioning that the statistical model creator 202 and the statistical model based predictor 203 as shown in FIG. 2 in the present invention can be implemented by a computing system that has one of more computing processors and memory devices configured to execute program instructions designed to perform the statistical modelling or prediction. They can also be dedicated hardware devices designed to deliver the required functionalities of the statistical model creator 202 and the statistical model based predictor 203.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A system for discovering unknown problematic circuit patterns in a chip design layout of manufactured semiconductor devices, comprising:

a critical signature library constructed by configuring a storage device, said critical signature library having at least one critical signature database stored in said storage device, each critical signature database including a plurality of known problematic circuit patterns extracted from said chip design layout, each problematic circuit pattern having associated physical data measured from the manufactured semiconductor devices and simulation data generated based on said chip design layout;

a statistical model creator interfacing with said critical signature library and creating at least one statistical model based on said plurality of known problematic circuit patterns according to a target specification based on deviation between the associated physical data and simulation data or design data, said at least one statistical model being saved in the corresponding critical signature database having said plurality of known problematic circuit patterns;

a statistical model based predictor interfacing with said critical signature library, receiving a plurality of candidate circuit patterns, predicting and labeling each of said plurality of candidate circuit patterns as being problematic or not according to said at least one statistical model;

wherein said statistical model predictor further saves each candidate circuit pattern labelled as being problematic in the corresponding critical signature database if the candidate circuit pattern labelled as being problematic does not match any of said plurality of known problematic circuit patterns in the corresponding critical signature database.

2. The system as claimed in claim 1, wherein said statistical model creator extracts a set of features associated with each of said plurality of known problematic circuit patterns and creating said at least one statistical model based on the features, and said statistical model based predictor extracts said set of features associated with each of said plurality of candidate circuit patterns and predicts if each candidate circuit pattern is problematic or not based on said set of features extracted from the candidate circuit pattern.

3. The system as claimed in claim 2, wherein said set of features associated with each of said plurality of known problematic circuit patterns or each of said plurality of candidate circuit patterns includes features extracted from one or more associated circuit patterns in said chip design layout.

4. The system as claimed in claim 3, wherein said one or more associated circuit patterns in said chip design layout includes at least one associated circuit pattern that has a size different from the associated known problematic circuit pattern.

5. The system as claimed in claim 3, wherein said one or more associated circuit patterns in said chip design layout includes at least one associated circuit pattern of an underneath layer of a current layer where the associated known problematic circuit pattern belongs to.

6. The system as claimed in claim 3, wherein more than one statistical model are created by said statistical model creator and saved in the corresponding signature database with each statistical model being created by a different set of features.

7. The system as claimed in claim 1, wherein more than one statistical model are created by said statistical model creator and saved in the corresponding signature database with each statistical model being created by a different statistical modeling algorithm.

8. The system as claimed in claim 1, wherein said deviation between the associated physical data and simulation data or design data is the deviation between physical measurement and simulation data or design data of a critical dimension.

9. The system as claimed in claim 1, wherein said deviation between the associated physical data and simulation data or design data is the deviation between physical measurement and simulation data or design data of an edge placement error.

10. The system as claimed in claim 1, wherein said deviation between the associated physical data and simulation data or design data is the deviation between physical measurement and simulation data or design data of a corner rounding.

11. A method for discovering unknown problematic circuit patterns in a chip design layout of manufactured semiconductor devices, comprising:
preparing a critical signature library including at least one critical signature database having a plurality of known problematic circuit patterns extracted from said chip design layout, each problematic circuit pattern having associated physical data measured from the manufactured semiconductor devices and simulation data generated based on said chip design layout;
creating at least one statistical model based on said plurality of known problematic circuit patterns according to a target specification based on deviation between the associated physical data and simulation data or design data, said at least one statistical model being saved in the corresponding critical signature database having said plurality of known problematic circuit patterns;
generating a plurality of candidate circuit patterns;
predicting and labeling each of said plurality of candidate circuit patterns as being problematic or not according to said at least one statistical model;
comparing each candidate circuit pattern labelled as being problematic with said plurality of known problematic circuit patterns; and
saving each candidate circuit pattern labelled as being problematic in the corresponding critical signature database if the candidate circuit pattern labelled as being problematic does not match any of said plurality of known problematic circuit patterns in the corresponding critical signature database, and removed the candidate circuit pattern from further prediction.

12. The method as claimed in claim 11, wherein in the step of creating at least one statistical model, a set of features associated with each of said plurality of known problematic circuit patterns is extracted for creating said at least one statistical model based on the features, and said set of features associated with each of said plurality of candidate circuit patterns is extracted in the step of predicting and labeling each of said plurality of candidate circuit patterns as being problematic or not.

13. The method as claimed in claim 12, wherein said set of features associated with each of said plurality of known problematic circuit patterns or each of said plurality of candidate circuit patterns includes features extracted from one or more associated circuit patterns in said chip design layout.

14. The method as claimed in claim 13, wherein said one or more associated circuit patterns in said chip design layout includes at least one associated circuit pattern that has a size different from the associated known problematic circuit pattern.

15. The method as claimed in claim 13, wherein said one or more associated circuit patterns in said chip design layout includes at least one associated circuit pattern of an underneath layer of a current layer where the associated known problematic circuit pattern belongs to.

16. The method as claimed in claim 13, wherein more than one statistical model are created and saved in the corresponding signature database with each statistical model being created by a different set of features.

17. The method as claimed in claim 11, wherein more than one statistical model are created and saved in the corresponding signature database with each statistical model being created by a different statistical modeling algorithm.

18. The method as claimed in claim 11, wherein said deviation between the associated physical data and simulation data or design data is the deviation between physical measurement and simulation data or design data of a critical dimension.

19. The method as claimed in claim 11, wherein said deviation between the associated physical data and simulation data or design data is the deviation between physical measurement and simulation data or design data of an edge placement error.

20. The method as claimed in claim 11, wherein said deviation between the associated physical data and simulation data or design data is the deviation between physical measurement and simulation data or design data of a corner rounding.

21. The method as claimed in claim 11, wherein said plurality of candidate circuit patterns are generated by dividing said chip design layout into a plurality of small tiles with each tile being a candidate circuit pattern.

22. The method as claimed in claim 11, wherein said plurality of candidate circuit patterns are generated by a random layout generator.

23. The method as claimed in claim 11, wherein said plurality of candidate circuit patterns are generated by extracting circuit patterns that have been revised in said chip design layout.

24. The method as claimed in claim 11, wherein said plurality of candidate circuit patterns are generated by extracting design clips from said chip design layout of hot spot locations determined by applying lithographic process check on said chip design layout with an aggressive setting.

25. The method as claimed in claim 24, wherein said lithographic process check includes verification with an extended process window setting.

26. The method as claimed in claim 11, wherein said plurality of candidate circuit patterns are generated by extracting design clips from a revision of said chip design layout of hot spot locations determined by applying lithographic process check on said revision of said chip design layout with an aggressive setting and an extended process window setting.

27. The method as claimed in claim 11, wherein said plurality of candidate circuit patterns generated by extracting design clips from said chip design layout of defect locations detected by inspecting an wafer of the manufactured semiconductor devices with an aggressive sensitivity setting.

28. The method as claimed in claim 27, wherein said wafer is a wafer with focus exposure matrix.

* * * * *